United States Patent [19]
Cavallotti et al.

[11] Patent Number: 6,045,604
[45] Date of Patent: Apr. 4, 2000

[54] AUTOCATALYTIC CHEMICAL DEPOSITION OF ZINC TIN ALLOY

[75] Inventors: Pietro Luigi Cavallotti; Vittorio Sirtori, both of Milan, Italy

[73] Assignee: International Business Machines Corporation, Armonk, N.Y.

[21] Appl. No.: 09/159,241

[22] Filed: Sep. 23, 1998

[30] Foreign Application Priority Data

Jan. 14, 1998 [GB] United Kingdom .................. 9800624

[51] Int. Cl.⁷ .................................................. C23C 18/48
[52] U.S. Cl. ....................... 106/1.22; 106/1.25; 106/1.29
[58] Field of Search ................................. 106/1.22, 1.25, 106/1.29

[56] References Cited

U.S. PATENT DOCUMENTS

| | | | |
|---|---|---|---|
| 3,669,854 | 6/1972 | Harbulak | 204/55 R |
| 5,304,403 | 4/1994 | Schlesinger et al. | 427/437 |
| 5,618,402 | 4/1997 | Sakurai et al. | 205/244 |

FOREIGN PATENT DOCUMENTS

| | | | |
|---|---|---|---|
| 0 132 311 | 1/1985 | European Pat. Off. | C25D 3/58 |
| 786768 | 11/1957 | United Kingdom . | |
| 1080291 | 8/1967 | United Kingdom | C23B 5/32 |
| 2019895 | 7/1979 | United Kingdom . | |
| 1572332 | 7/1980 | United Kingdom | C23C 3/00 |
| 2126249 | 3/1984 | United Kingdom | C25D 5/48 |
| 2216146 | 4/1989 | United Kingdom | C23C 18/46 |
| 2312391 | 10/1997 | United Kingdom | B23K 1/20 |

*Primary Examiner*—Helene Klemanski
*Attorney, Agent, or Firm*—Steven Capella

[57] ABSTRACT

A method and a bath for autocatalytic chemical deposition of a Sn Zn alloy on a catalytic surface. The method is particularly useful in the manufacture of electronic components, when the deposition of a thin layer of Sn Zn alloy is needed before the deposition of the Sn alloy (particularly Pb free) to improve the solderability characteristics of the Cu surface. The Cu surface must be made catalytic before immersion in the autocatalytic bath, e.g. by depositing a thin film of metallic Sn.

3 Claims, No Drawings

AUTOCATALYTIC CHEMICAL DEPOSITION OF ZINC TIN ALLOY

TECHNICAL FIELD

The present invention relates to a method for autocatalytic chemical deposition of a Zn—Sn alloy on a catalytic surface; it further relates to a circuit board and to a method for manufacturing said circuit board.

BACKGROUND ART

The use of tin base solder alloys is common in electronic applications, particularly in the manufacture of printed circuit boards (PCB). These alloys provide mechanical and electrical connection in assembly of components onto the boards. These tin solder alloys are useful in joining integrated circuit chips to chip carriers and substrates, joining chip carriers to substrates, and joining circuitization lands and pads in multilayer printed circuit boards.

In the manufacture of a microelectronic package, it is common practice to attach a component onto a printed circuit board or the like, for example by surface mounting utilizing a solder connection. For this purpose, the board features a Cu circuit trace including a pad that constitutes a first surface for the connection; similarly, the component includes a second surface, for example a Cu contact.

The interconnection method comprises the steps of applying a solder alloy on the Cu substrate, typically onto the pad included in the printed circuit board.

The electronic components to be joined with the board are then brought into contact with the solder layer. The solder alloy is heated to cause the solder alloy to melt and reflow; heating may be by vapour phase reflow, infrared reflow, laser reflow, or the like. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing.

Tin-lead (Sn—Pb) alloys have been used for most electronic soldering operations. These alloys have been selected because of their mechanical strength, low relative cost, electrical conductivity and excellent wetting characteristics; wettability is an indication of how completely and quickly the molten solder can cover a solid surface. In addition, Sn—Pb alloys provide a low melting temperature, which is important in electronic applications because many components and printed circuit boards use materials that are easily damaged by exposure to high temperature during manufacture or assembly.

However, lead has been recognized as a health hazard, being toxic for workers and for the environment; recently governments have begun to urge the electronic industry to find alternatives to lead in order to reduce electronic industry worker lead exposure and reduce the amount of lead waste going back into the environment.

Lead presence in the soldering alloys is particularly critical in the manufacture of the most recent generation of C-MOS; in fact the features are so thin in this kind of board, that the emission of α particles from the emitting radioisotope present in the lead can provoke serious problems for the device.

Tin-Bismuth (Sn—Bi) solder alloys were investigated as alternative to Sn—Pb solder alloys. Electrodeposition of such Sn—Bi alloys from different electrolytes and in particular from alkyl sulphonate baths is known in the art, as described in Surf. & Coat. Tech-Vol. 27, 151–166 (1986)-Y. N. Sadana, R. N. Gedye, S. Ali. Electrodeposition of Sn-Bi alloys onto a PCB with an alkyl sulphonate electrolyte is also described in U.S. Pat. No. 5,039,576.

Lead-free solder alloys known in the art present however some drawbacks. They exhibit poor soldering and metallurgical properties, that is small peel strength and low creep resistance. Particularly, they have shown poor mechanical properties at temperatures of the type typically encountered by microelectronic packages during use.

EP-A-97300569.7 discloses a method of pretreating the copper surface by applying a thin film of zinc with the purpose of improving the solder property of tin based solder alloys. Zn is believed to be usually harmful for a soldering process if present in a Sn alloy. The result is that the wettability of the alloy is decreased, because Zn is highly reactive with Oxygen and during reflow produces Zn oxide which compromises the connection between the pins of the electronic component and the solder alloy and prevents solder coalescence. However if a thin Zn layer is deposited onto the Cu substrate before depositing the solder alloy, during the reflow it does not come in contact with oxygen and it does not oxidize. A very thin Zn layer is able to significantly improve the mechanical and electrical properties of the solder layer which is hundreds of time thicker. This effect seems to be mainly due to the ternary alloy CuZnSn which is formed near the surface of the Cu substrate. Studying the thermodynamic behaviour, it is possible to see that the Sn and Zn attractive interaction for Cu atoms is in some way increased by their mutual repulsion, influencing the valence band, through possible orbital hybridization, and increasing the ternary alloy stability. The increase of the number of states at the Fermi energy level could account for a possible increase of the interface electrical properties.

Another important effect of the Zn pretreatment of the Cu substrate is related to the aging behaviour of the coating. Artificial aging experiments have shown a good behaviour of the ternary alloy CuZnSn obtained with the above method, due to the high deposit uniformity if compared with other Pb free solder methods.

According to the preferred embodiment described in the above patent application, the deposition of the Zn layer on the Cu substrate is performed with a process of electrodeposition.

The Cu substrate is immersed in the bath, spaced apart from a suitable counterelectrode (anode). An electrical current is applied to the anode for cathodically reducing the salts in the bath (in this case Zn) to their respective metals and thereby deposit the desired solder alloy onto the board. The conductive substrate is kept immersed for a time sufficient to deposit a solder alloy coating of the desired thickness and composition upon the substrate. The substrate is subsequently withdrawn from the electroplating bath. The plated conductive substrate is thereafter washed thoroughly as quickly as possible, to minimize staining. The electrodeposition bath can be either an acid or a basic electrolyte.

The electrodeposition process has the drawback of requiring electrical connection to the area where the treatment is needed and this can cause some problems in many case. For these reasons a simpler method for applying the zinc film coating would be highly desirable.

U.S. Pat. No. 4,269,625 discloses a method for electroless deposition of tin on a catalytic surface by means of a highly alkaline solution which contains stannous ions.

Tin can be chemically deposited by means of a disproportionation reaction in alkaline solutions of the type:

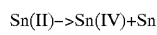

This reaction is autocatalytic and occurs preferentially on metallic surfaces on which metallic tin is present, as explained also in U.S. Pat. No. 4,269,625 mentioned above.

It is an object of the present invention to provide a technique which alleviates the above drawbacks.

SUMMARY OF THE INVENTION

According to the present invention we provide an alkaline bath for autocatalytic chemical deposition of Sn Zn alloy on a catalytic surface containing Zn salt in the quantity of 0.1 to 1 mol, Sn salt in the quantity of 0.01 to 0.5 mol and a complexing agent in the quantity of 0.1 to 1.5 mol.

DETAILED DESCRIPTION OF THE PREFERRED EMBODIMENT

It is thus possible to deposit with an electroless process a layer of Zn and Sn on a metallic surface. This film improves the solderabilty properties of a Sn alloy and it is particularly useful in the manufacturing of electronic packages, when metallic components with Cu contacts must be soldered to a substrate having Cu circuit traces by means of a Sn based alloy (e.g. Sn—Bi alloy).

As mentioned above the autocatalytic reaction can start if the surface is catalytic. In the case of a copper substrate, in order to make the surface catalytic, the copper should be activated with the deposition of a thin film of Sn. According to a preferred embodiment this activation is done by immersing the copper substrate in a pretreatment acid solution containing Sn salt and a reducing agent (e.g. thiourea). The solution can be stabilized with the addition of Zn salts and hypophosphites. The components should be in the following ranges:

| Sn salt | 0.005–0.1 | mol |
| reducing agent | 0.01–1 | mol |
| acid | 0.1–1 | mol |
| stabilizers | 0.1–1 | mol |

In a specific example the above solution should contain 0.2 mol of sulphuric Acid ($H_2SO_4$), 0.3 mol of thiourea (($H_2N)CS(NH_2)$)) 0.15 mol of sodium hypophosphite ($NaH_2PO_2$), 0.01 of tin sulphate ($SnSO_4$)and 0.1 of zinc sulphate ($ZnSO_4$). The copper substrate is immersed in this solution for 3 min at 25° C. and then rinsed with deionized water.

The above described pretreatment method has the effect of depositing a thin film of metallic Sn on the copper surface, which activates the autocatalytic chemical process of deposition of Sn and Zn. Anyway the activation can be realised with other methods. Alternatively the autocatalytic deposition of the Sn Zn alloy can be done on any catalytic surfaces (e.g. a tin surface).

The catalytic surface is then immersed in an alkaline autocatalytic bath containing Sn and Zn salts. The composition of the bath solution should be in the following ranges:

| Zn salt | 0.1–1 | mol |
| Sn salt | 0.01–0.5 | mol |
| complexing agent | 0.1–1.5 | mol |
| Alkali | 1–5 | mol |

According to a preferred embodiment the Zn salt is zinc acetate $ZN(CH_3COO)$ in the quantity of 0.5 mol and the Sn salt is tin sulphate $SnSO_4$ in the quantity of 0.03 mol.

The solution is prepared by dissolving the alkali (e.g. caustic soda) in water to obtain a concentration of 5 mol; then the zinc acetate is added to reach a final concentration of 0.5 mol. Finally the complexing agent (e.g. Na citrate) and the tin sulphate are added in order to obtain a final concentration of 0.3 and 0.03 mol respectively.

According to a preferred embodiment, the activated copper surface is immersed in the above described autocatalytic solution for 10 min at a temperature of 75° C. Afterwards it is rinsed in deionized water and dried in nitrogen atmosphere.

Laboratory tests have been performed to detect the presence of zinc and tin with the above described autocatalytic chemical deposition method. ESCA-XPS measurements has been used with monochromatic Al $K\alpha$ X-ray source (1486.67 eV) pass energy 58.7 eV, sputtering rate 2nm/min, detector/sample angle 45°. The following results have been obtained:

| DISTANCE FROM SURFACE | C | O | Zn | Sn | Cu |
| --- | --- | --- | --- | --- | --- |
| surface | 21% | 43% | 24% | 10% | 2% |
| 5nm | 1 | 16 | 20 | 28 | 35 |
| 10nm | 3 | 8 | 13 | 26 | 50 |
| 15nm | 3 | 5 | 9 | 19 | 64 |
| 20nm | — | 4 | 7 | 14 | 75 |
| 25nm | — | 2 | 6 | 9 | 83 |
| 30nm | — | 1 | 4 | 5 | 90 |
| 40nm | — | 1 | 2 | 2 | 95 |
| 50nm | — | — | 2 | 1 | 97 |

The above percentages show that the deposition of both Zn and Sn is well established not only on the external surface. This coating is particularly useful in the manufacturing of electronic modules when a component having Cu contacts must be soldered to a substrate (e.g. a printed circuit board) having Cu circuit traces, because it considerably improves the peeling strength of joints, particularly when soldered with Sn alloys. The effect and the results of the above described coating is very similar to the thin zinc deposition described in EP-A-97300569.7 but using the method according to the present invention no electricity is needed. Those skilled in the art will easily appreciate that a thicker layer of Sn Zn alloy could be deposited with a longer immersion time.

We claim:

1. An alkaline bath for autocatalytic chemical deposition of Sn Zn alloy on a catalytic surface containing Zn salt in the quantity of 0.1 to 1 mol, Sn salt in the quantity of 0.01 to 0.5 mol, a complexing agent in the quantity of 0.1 to 1.5 mol and an alkali.

2. The alkaline bath of claim 1 wherein the concentration of the Zn salt is 0.5 mol, the concentration of Sn salt is 0.03 mol, the concentration of the complexing agent is 0.3 and the concentration of the alkali is 5 mol.

3. The alkaline bath of claim 2 wherein the Zn salt is zinc acetate $Zn(CH_3COO)$, the Sn salt is tin sulphate $SnSO_4$, the complexing agent is Na citrate and the alkali is caustic soda.

* * * * *